US010101834B2

(12) United States Patent
Zheng (10) Patent No.: US 10,101,834 B2
(45) Date of Patent: Oct. 16, 2018

(54) ARRAY SUBSTRATE, TOUCH DISPLAY DEVICE AND DRIVING METHOD (71) Applicants: BOE Technology Group Co., Ltd., Beijing (CN); Beijing BOE Optoelectronics Technology Co., Ltd., Beijing (CN)

(72) Inventor: Dan Zheng, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 102 days.

(21) Appl. No.: 14/774,887

(22) PCT Filed: Oct. 1, 2014

(86) PCT No.: PCT/CN2014/088087
§ 371 (c)(1),
(2) Date: Sep. 11, 2015

(87) PCT Pub. No.: WO2016/019628
PCT Pub. Date: Feb. 11, 2016

(65) Prior Publication Data
US 2016/0202815 A1  Jul. 14, 2016

(30) Foreign Application Priority Data
Aug. 7, 2014  (CN) .......................... 2014 1 0386497

(51) Int. Cl.
G06F 3/045      (2006.01)
G06F 3/041      (2006.01)
(Continued)

(52) U.S. Cl.
CPC ............ *G06F 3/0412* (2013.01); *G06F 3/044* (2013.01); *G06F 3/0416* (2013.01); *H01L 27/124* (2013.01); *G06F 2203/04111* (2013.01)

(58) Field of Classification Search
CPC .................. G06F 3/044; G06F 3/0416; G06F 2203/04111; G06F 3/0412; H01L 27/124
(Continued)

(56) References Cited

U.S. PATENT DOCUMENTS 8,825,234 B2 *  9/2014  Williams ............... G01C 21/20
                                                          701/10
2012/0133612 A1  5/2012  Wang et al.
(Continued)

FOREIGN PATENT DOCUMENTS

CN    102466909 A     5/2012
CN    102768604 A     11/2012
(Continued)

OTHER PUBLICATIONS

Aug. 18, 2016—(CN)—First Office Action Appn 201410386497.5 with English Tran.
Apr. 29, 2015—International Search Report and Written Opinion Appn PCT/CN2014/088087 with English Tran.

*Primary Examiner* — Mark Regn
(74) *Attorney, Agent, or Firm* — Banner & Witcoff, Ltd.

(57) ABSTRACT

An array substrate, a touch display device, and a driving method are provided. The array substrate includes a data line layer which includes a plurality of first touch electrodes; a common electrode layer which includes a plurality of second touch electrodes; and a first switch signal line. Each first touch electrode includes a plurality of data lines and a plurality of first switch elements, a control terminal (a) of the first switch element is connected to the first switch signal line, a first terminal (b) of the first switch element is connected one of the data lines in the first touch electrode,
(Continued)

and a second terminal (c) of the first switch element is connected another of data lines in the first touch electrode, so that all of the data lines in the first touch electrode are electrically connected to each other upon the first touch electrode being turned on.

20 Claims, 5 Drawing Sheets

(51) Int. Cl.
     *H01L 27/12*      (2006.01)
     *G06F 3/044*      (2006.01)

(58) Field of Classification Search
     USPC .......................................................... 345/174
     See application file for complete search history.

(56) References Cited

U.S. PATENT DOCUMENTS

| | | | |
|---|---|---|---|
| 2014/0160061 A1* | 6/2014 | Kim | G02F 1/13338 345/174 |
| 2015/0049050 A1* | 2/2015 | Zhao | G06F 3/0416 345/174 |

FOREIGN PATENT DOCUMENTS

| | | | |
|---|---|---|---|
| CN | 103018992 A | * | 4/2013 |
| CN | 103197796 A | | 7/2013 |
| CN | 103698949 A | | 4/2014 |
| CN | 103761014 A | | 4/2014 |

* cited by examiner

| during a touch period of time, the first switch signal terminal applies an ON signal to the control terminal of each of the first switch elements via the first switch signal line and the first touch signal terminals apply touch scan signals to the plurality of the first touch electrodes or the second touch signal terminal apply touch scan signals to the plurality of the second touch electrodes | 501 |

↓

| during a display period of time, each of the first switch elements is turned off | 502 |

ARRAY SUBSTRATE, TOUCH DISPLAY DEVICE AND DRIVING METHOD

The application is a U.S. National Phase Entry of International Application No. PCT/CN2014/088087 filed on Oct. 1, 2014, designating the United States of America and claiming priority to Chinese Patent Application No. 201410386497.5 filed on Aug. 7, 2014. The present application claims priority to and the benefit of the above-identified applications and the above-identified applications are incorporated by reference herein in their entirety.

TECHNICAL FIELD

Embodiments of the present disclosure relate to an array substrate, a touch display device, and a driving method.

BACKGROUND

At present, touch drive lines and touch sensing lines are added into an existing thin film transistor (TFT) array substrate to form a mutual capacitive in-cell touch screen to achieve a touch function. For example, a metal wire matrix is formed along the horizontal direction and the vertical direction of the TFT array substrate; the metal wires in the horizontal direction server as touch drive electrodes, and the metal wires in the vertical direction server as touch sensing electrodes insulated from the touch drive electrodes. The in-cell touch screen operates in such a process: touch drive signals are applied to the touch drive electrodes and voltage signals, over the touch sensing line, coupled out through mutual capacitors are detected. In the process, where a human touches the touch screen, an electric field by his/her body acts on the capacitors formed between the touch sensing electrodes and the touch drive electrodes, so that the capacitance of the capacitors is changed and thereby the voltage signals of the touch sensing line coupled out are changed and the contact location can be determined based on the change of the voltage signals.

SUMMARY

At least one embodiment of the present disclosure provides an array substrate including: a data line layer which includes a plurality of first touch electrodes; a common electrode layer which includes a plurality of second touch electrodes which are arranged to insulate from and cross the first touch electrodes; and a first switch signal line. Each first touch electrode includes a plurality of data lines and a plurality of first switch elements, a control terminal of each first switch element is connected to the first switch signal line, a first terminal of the first switch element is connected one data line in the first touch electrode, and a second terminal of the first switch element is connected another data line in the first touch electrode, so that all of the data lines in the first touch electrode are electrically connected to each other upon the first switch element being turned on.

In an embodiment, the data line connected to the first terminal of the first switch element and the data line connected to the second terminal thereof are adjacent to each other.

In an embodiment, each of the first touch electrodes includes 15 to 20 data lines; and/or a width of each of the second touch electrodes is from 4 nm to 10 mm.

In an embodiment, the second touch electrode is made of indium tin oxide.

In an embodiment, the array substrate further includes a second switch signal line and a plurality of second switch elements; the second switch signal line is connected to the plurality of second touch electrodes via the plurality of second switch elements and is configured such that the plurality of second touch electrodes are electrically connected to each other upon the plurality of second switch elements connected to the plurality of second touch electrodes being turned on, and/or wherein the second switch signal line is connected to the plurality of first touch electrodes via the plurality of second switch elements and is configured such that the plurality of first touch electrodes are electrically connected to each other upon the plurality of second switch elements connected to the plurality of first touch electrodes being turned on.

In an embodiment, for any one of the plurality of second switch elements connected to the plurality of second touch electrodes, a control terminal thereof is connected to the second switch signal line, a first terminal thereof is connected to one second touch electrode, and a second terminal thereof is connected with another second touch electrode; and/or for any one of the plurality of second switch elements connected to the plurality of first touch electrodes, a control terminal thereof is connected to the second switch signal line, a first terminal thereof is connected to one data line in one of the first touch electrodes, and a second terminal thereof is connected with one data line in another of the second touch electrodes.

In an embodiment, for any one of the plurality of second switch elements connected to the plurality of second touch electrodes, the one second touch electrode connected to the first terminal thereof and the another second touch electrode connected to the second terminal thereof are adjacent to each other; and/or for any one of the plurality of second switch elements connected to the plurality of first touch electrodes, the one first touch electrode connected to the first terminal thereof and the another first touch electrode connected to the second terminal thereof are adjacent to each other.

At least one embodiment of the present disclosure provides a touch display device including any one of the array substrates above.

At least one embodiment of the present disclosure provides a driving method for the touch display device including the first switch elements and the first switch signal line, including: during a touch period of time, applying an ON signal, by a first switch signal terminal, to a control terminal of each of the first switch elements via the first switch signal line, and applying touch scan signals, by first touch signal terminals, to the plurality of first touch electrodes or applying touch scan signals, by second touch signal terminals, to the plurality of second touch electrodes; and during a display period of time, turning off each of the first switch elements.

At least one embodiment of the present disclosure provides a driving method for the touch display device including the second switch elements, the second switch signal line, the first switch elements, and the first switch signal line, including: during a touch period of time, applying an ON signal, by first switch signal terminals, to a control terminal of each of the first switch elements via the first switch signal line, turning off the second switch elements, and sequentially applying touch scan signals, by first touch signal terminals, to the plurality of first touch electrodes or sequentially applying touch scan signals, by second touch signal terminals, to the plurality of second touch electrodes; during a transition period of time after the touch period of time ends and before a display period of time starts, applying an ON signal, by the first switch signal terminal, to the control terminal of each of the first switch elements via the first switch signal line and applying an ON signal, by the second touch signal terminal, to a control terminal of each of the second switch elements via the second switch signal line; and during the display period of time, turning off each of the first switch elements and each of the second switch elements.

For example, during a sub-period of time of the display period of time between time of applying gate drive signals to any two adjacent gate lines, the first switch signal terminal applies an ON signal to the control terminal of each of the first switch elements via the first switch signal line and the second touch signal terminal applies an ON signal to the control terminal of each of the second switch elements via the second switch signal line; and during other sub-period of time of the display period of time, each of the first switch elements and each of the second switch elements are turned off.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the invention and thus are not limitative of the invention.

| Numeral references: | | |
|---|---|---|
| 11: first substrate | 12: display array circuit | 13: touch array circuit |
| 14: liquid crystal layer | 15: sealant | 16: color filter layer |
| 17: black matrix | 18: second substrate | |
| 31: second touch electrode | 32: first touch electrode | 33: first switch element |
| 34: first switch signal line | 35: second switch signal line | 36: second switch element |
| 37: data line | | |

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the present disclosure. Based on the described embodiments herein, those skilled in the art can obtain all of other embodiments, without any inventive work, which should be within the scope of the invention.

Figure 1:
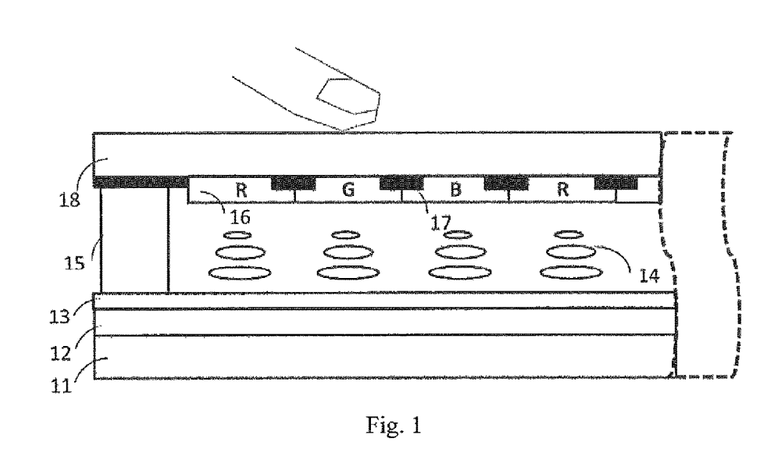
FIG. 1 is a schematic diagram of a configuration of a touch display panel.
Figure 2:
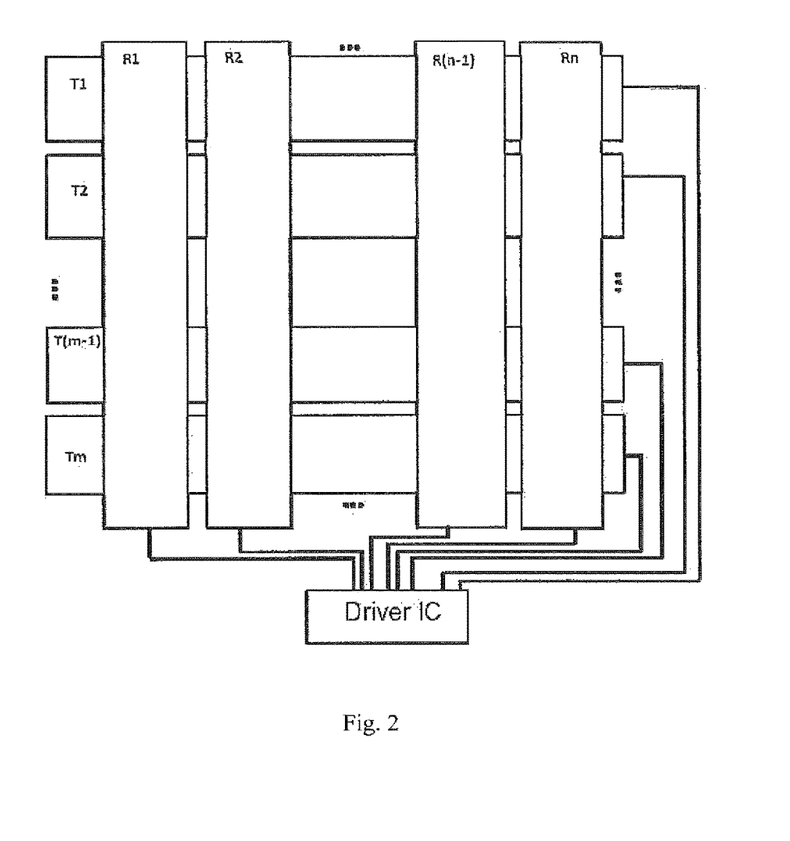
FIG. 2 is a schematic diagram of a touch array circuit arranged in FIG. 1.

FIG. 1 is a schematic diagram of a configuration of an in-cell touch display panel. As illustrated in FIG. 1, the touch display panel includes a first substrate 11 and a second substrate 18. The first substrate 11 is provided with a display array circuit 12 and a touch array circuit 13, and the second substrate 18 is provided with a black matrix 17 and a color filter layer 16. A liquid crystal layer 14 is provided between the first substrate 11 and the second substrate 18, and the first substrate 11 and the second substrate 18 are oppositely arranged to be sealed by sealant 15 to enable the first substrate 11 and the second substrate 18 to form a liquid crystal cell. Touch array circuit 13 includes touch drive electrodes and touch sensing electrodes which are crossed and respectively in two different planes as illustrated in FIG. 2. Touch array circuit 13 may include touch drive electrodes Tx and touch sensing electrodes Rx which are crossed and respectively in two different planes, the touch drive electrodes T1, T2, . . . , Tm are not connected to each other, and the touch sensing electrode R1, R2, . . . , Rn are not connected to each other, which configuration achieves touch control of the touch screen.

However, the touch array circuit 13, such as the touch drive electrode and the touch sensing electrode, is required to be additionally added into the liquid crystal cell in the configurations of FIG. 1 and FIG. 2 mentioned above, which results in a higher cost of the in-cell touch display panel and increases the complexity of the manufacturing process of the in-cell touch display panel.

Figure 3:
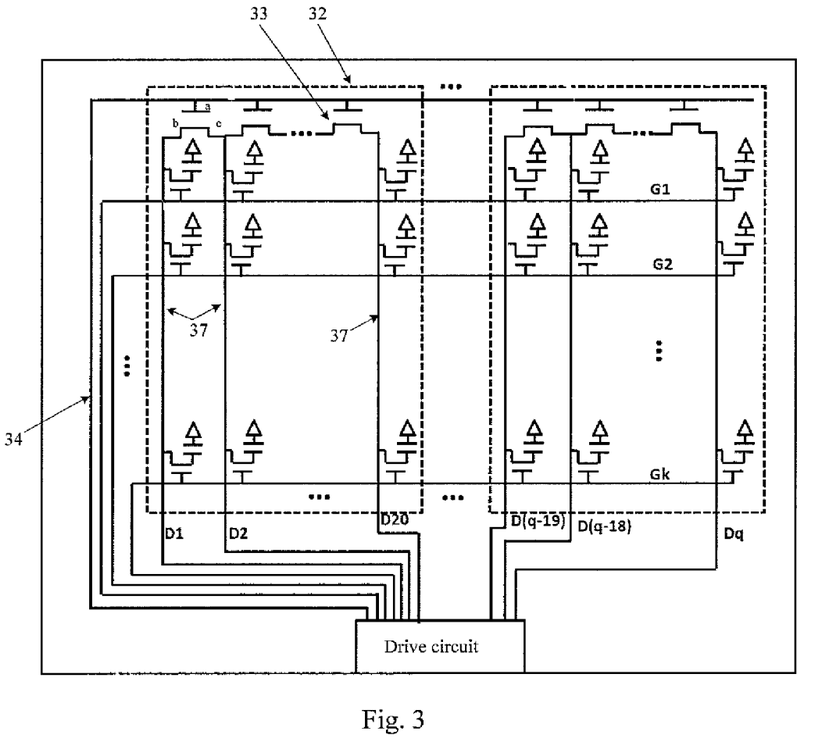
FIG. 3 is a schematic diagram of a configuration of an array substrate according to a first embodiment of the present disclosure.

FIG. 3 shows a schematic diagram of a configuration of an array substrate according to a first embodiment of the present disclosure. As illustrated in FIG. 3, the array substrate of this embodiment includes a data line layer, a common electrode layer, and a first switch signal line 34.

The array substrate according to the embodiment of the present disclosure includes a plurality of gate lines and a plurality of data lines, and these gate lines and the data lines cross each other to define pixel units arranged in an array; each of the pixel units may include a thin film transistor as a switch element and include a pixel electrode and a common electrode for controlling the arrangement of the liquid crystal. For example, the gate electrode of the thin film transistor is electrically connected to the respective gate line in each pixel, and the source electrode thereof is electrically connected to the respective data line, and the drain electrode thereof is electrically connected to the respective pixel electrode.

The data line layer includes a plurality of first touch electrodes 32, each of the first touch electrodes 32 includes a plurality of data lines 37 and a plurality of first switch element 33. In this embodiment, one terminal of a first touch electrode 32 is connected to a first touch signal terminal. The common electrode layer includes a plurality of second touch electrodes 31, and one terminal (lower portion in FIG. 3) of a second touch electrode is connected to a second touch signal terminal (not illustrated in FIG. 3). The second touch electrodes 31 are arranged to insulate from and cross the first touch electrodes 32. The first switch signal line 34 is connected to first switch signal terminal.

For any one first touch electrode 32 of any one first touch electrodes 33, a control terminal "a" thereof is connected to a first switch signal line 34, the first terminal "b" thereof is connected to one data line 37 in the first touch electrode 32, and the second terminal "c" thereof is connected to another data line 37 in the first touch electrode 32, so that all of the data lines in the first touch electrode 32 are electrically connected to each other when all of the first switch elements 33 in the first touch electrode 32 are turned on.

It may be understood that, in this embodiment, the plurality of data lines in one first touch electrode 32 are electrically connected to each other as a whole when the touch display device including the array substrate is in a touch period of time. Thus, during the touch period of time, all of the first switch elements 33 in each of the first touch electrodes 32 in the array substrate according to this embodiment must be turned on to enable all of the data lines in the first touch electrode 32 to be electrically connected to better determine the contact location.

In addition, when the touch display device including the array substrate is during the touch period of time, if one or more of the first switch elements in a first touch electrode are disconnected to enable a part of the data lines in the first touch electrode 32 to be electrically disconnected, the touch operation may be failure, or the contact location cannot be identified. Therefore, during the touch period of time, adjacent data lines D1, D2, . . . , D20 in FIG. 3 are electrically connected as the first one R1 of the first touch electrodes via the plurality of first switch elements. Successively, adjacent data lines D (q-19), D (q-18), . . . , Dq are electrically connected as the n-th one Rn of the first touch electrodes via the plurality of first switch element. Here, both n and q are natural numbers.

Thus, the touch display device including the array substrate according to this embodiment is not required to additionally dispose a touch array circuit in the array substrate as illustrated in FIG. 1, with the data line layer being configured for the first touch electrodes and the common electrode layer being configured for the second touch electrodes, and addresses the problem of the higher cost and the bigger complexity of the manufacturing process of the touch panel due to separate provision of the touch array circuit.

It should be explained that the first touch signal terminals, the second touch signal terminals, and the first switch signal terminal as described above may be connected to different pins of one drive circuit, or may be connected to different drive circuits. In the embodiment as illustrated in FIG. 3, the first touch signal terminals, the second touch signal terminals, and the first switch signal terminal are connected to different pins of one drive circuit. Here, for clarity and simplicity, numeral references for identifying the first touch signal terminals, the second touch signal terminals, and the first switch signal terminal of the drive circuit are not illustrated in FIG. 3.

For example, the first touch electrodes as described above may be touch sensing electrodes (Rx), and the second touch electrodes may be touch drive electrodes (Tx). In this case, the second touch signal terminals apply touch scan signals to the second touch electrodes, and the first touch signal terminals detect voltage signals generated by coupling from the touch scan signals. Or, the first touch electrodes may be touch drive electrodes, and the second touch electrodes may be touch sensing electrodes. In this case, the first touch signal terminals apply touch scan signals to the first touch electrodes, and the second touch signal terminals detect voltage signals generated by coupling from the touch scan signals.

For example, the second touch electrode may be prepared by a transparent conductive material, such as indium tin oxide (ITO), which is only an example and is not a limit upon the material of the second touch electrode. The specific material can be selected according to the practical requirements.

In this embodiment, to improve the identification accuracy rate of the array substrate during a touch period of time, the width of a second touch electrode is set in a range from 4 mm to 10 mm and/or the width of a first touch electrode is set in the range from 4 mm to 10 mm. For example, in one example, the width of the first touch electrode and the second touch electrode is set in the range from 5 mm to 7 mm. It can be understood that, for example, the resolution of a display pixel in a touch screen (Liquid Crystal Display or OLED) is usually at about 100 microns and thus one of the second touch electrodes and one of the first touch electrodes in this embodiment will cover pixel units in a plurality of rows or columns of the array substrate. The resolution of this embodiment refers to the size of a touch unit of a touch screen or a pixel unit of a display screen.

For example, the width of one data line in the data line layer of the array substrate is from 50 to 120 µm. Therefore, a first touch electrode according to this embodiment may include 15-20 data lines so that the width of the first touch sensing electrode is set in the range from 5 to 7 mm.

Of course, under a special circumstance, a first touch electrode may include one or two data lines. In this case, the width of the first touch electrode may be in the range of 50 to 150 µm.

For example, in order to simplify the manufacturing process of the array substrate while reducing the cost of the array substrate, the data line connected to the first terminal b of a first switch element is arranged to be adjacent to the data line connected to the second terminal c of the first switch element, as illustrated in FIG. 3. Such an arrangement may further improve the touch sensitivity and the identification accuracy during the touch period of time.

Optionally, the array substrate illustrated in FIG. 3 includes a first switch signal line. Of course, in another embodiment, a plurality of first switch signal lines connected to the first switch signal terminals are provided. The embodiments of the present disclosure not limited in this aspect and may be set according to the practical requirements.

The array substrate in this embodiment is capable of realizing both the display function and the touch function and simplifying the manufacturing process of the array substrate while reducing the manufacturing cost of the array substrate.

Figure 4:
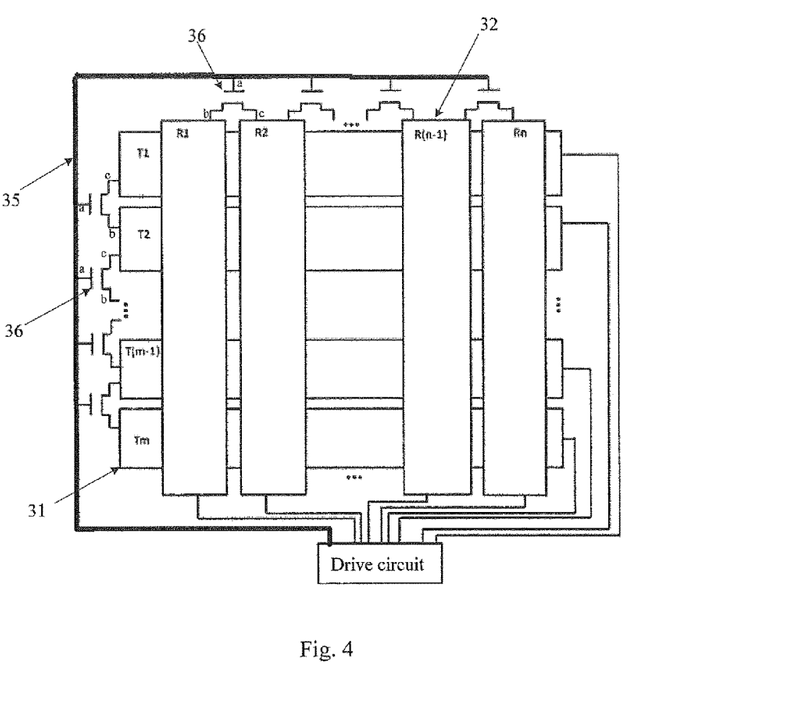
FIG. 4 is a schematic diagram of a configuration of an array substrate according to a second embodiment of the present disclosure.

FIG. 4 is a schematic diagram of a configuration of an array substrate according to a second embodiment of the present disclosure. As illustrated in FIG. 4, the array substrate in this embodiment includes a second switch signal line 35 and second switch elements 36 on the basis of the array substrate as illustrated in FIG. 3. For clarity, the first switch signal line 34, the data lines 37, and the first switch elements 33 are not illustrated again. However, it should be understood that there are still provided the first switch signal line 34, the data lines 37, and the first switch elements 33 in this embodiment.

The second switch signal line in this embodiment is connected to the second switch signal terminal. The second switch signal line 35 is connected to the plurality of second touch electrodes 31 through the plurality of second switch elements 36 to enable the plurality of second touch electrodes 31 to be electrically connected to each other when the plurality of second switch elements 36 connected to the plurality of second touch electrodes 31 are turned on.

In other words, the array substrate in this embodiment enables the plurality of second touch electrodes 31 to be electrically connected to each other and thereby realizes the charge sharing over the plurality of second touch electrodes 31 when the plurality of second switch elements 36 of the plurality of second touch electrodes 31 are turned on, during a transition period of time after the touch period of time ends and before a display period of time starts.

In another possible embodiment, the second switch signal line 35 is connected to the plurality of first touch electrodes 32 via the plurality of second switch elements 36 such that the plurality of first touch electrodes 32 are electrically connected to each other when the plurality of second switch elements 36 connected to the plurality of first touch electrodes 32 are turned on, thereby realizing the charge sharing over the plurality of first touch electrodes 32. In addition, the array substrate in this embodiment enables the plurality of first touch electrodes 32 to be electrically connected to each other so as to realize the charge sharing thereof and thus eliminate the charge accumulated over the plurality of first touch electrodes 32 when the plurality of second switch elements 36 connected to the plurality of first touch electrodes 32 are turned on and all of the first touch electrodes 33 in each of first touch electrodes 32 are electrically connected, during the transition period of time after the touch period of time ends and before a display period of time starts.

The array substrate in this embodiment can not only reduce the cost of manufacturing the array substrate in the in-cell touch screen, but also eliminate the charge accumulated in the data line layer and/or the common electrode layer in the array substrate, and thus reduce the power consumption of the driving circuit.

In one example, for any one of the second switching elements 36 connected to the plurality of second touch electrodes 31, the control terminal "a" of the second switching element is connected to the second switch signal line 35, the first terminal "b" thereof is connected to one of the second touch electrodes 31, and the second terminal "c" thereof is connected to other one of the second touch electrodes 31.

For example, to reduce the complexity of the manufacturing process, for any one of the second switching elements 36 connected to the plurality of second touch electrodes 31, one of the second touch electrodes 31 that is connected to the first terminal "b" and the other one of the second touch electrodes 31 that is connected to the second terminal "c" thereof are adjacent to each other, as illustrated in FIG. 4.

In addition, for any one of the second switching elements 36 connected to the plurality of first touch electrodes 32, the control terminal of this second switching element is connected to the second switch signal line 35, the first terminal "b" thereof is connected to one of the data lines in one of the first touch electrodes 32, and the second terminal "c" thereof is connected to one of the data lines in the other of the first touch electrodes 32. Accordingly, to reduce the complexity of the manufacturing process, for any one of the second switching elements 36 connected to the plurality of first touch electrodes 32, one of the first touch electrodes 32 that is connected to the first terminal "b" and the other of the first touch electrodes 32 that is connected to the second terminal "c" thereof are adjacent to each other.

In addition, the array substrate illustrated in FIG. 4 includes one second switch signal line 35 connected to the second switch signal terminal. Of course, in other embodiment, a plurality of second switch signal lines may be arranged, which is not limited in the embodiments of the present disclosure and can be set according to the practical requirements.

For example, the second switch signal terminal, the first switch signal terminal, the first touch signal terminals, and the second touch signal terminals may be connected to different pins of one drive circuit, or may be connected to different drive circuits. In the embodiment as illustrated in FIG. 4, the second switch signal terminal, the first switch signal terminal, the first touch signal terminals, and the second touch signal terminals are connected to the same drive circuit. Here, for clarity and simplicity, the respective numeral references are not illustrated in the drive circuit.

In FIG. 4, the common electrode layer can be divided into several independent parts T1, T2, . . . , Tm as the second touch electrodes 31, and the data layer can be divided into several independent parts R1, R2, . . . , Rn as the first touch electrodes 32. Moreover, in the figure, the adjacent two of the second touch electrodes 31 are respectively connected the same second switch element 36, and the adjacent two of the first touch electrodes 32 are respectively connected to the same second switch element 36.

The array substrate in this embodiment achieves the touch function with the data line layer and the common electrode layer, thus the touch display device including the array substrate can address the problems of the higher cost due to separately providing the touch array circuit, the presence of artifacts in display, and the touch insensitivity.

In other words, this embodiment achieves the touch function with the data line layer and the common electrode layer that originally provided in the array substrate, thus it is not necessary to add other processes, thereby simplifying the process and reducing the cost.

During a touch period of time, the first switching elements 33 (shown in FIG. 3) in the array substrate in FIG. 4 are turned on, the second switch elements 36 are turned off, the second touch signal terminal apply touch scan signals to the second touch electrodes 31, and the first touch signal terminal may be used to detect voltage signals, generated by coupling from the touch scan signals, in the first touch electrodes 32.

For example, the second touch electrodes 31 and the first touch electrodes 32 are set to be insulated from each and cross each other to form touch sensing bridges which are configured as mutual capacitors, and there are m*n sensing bridges. For example, a first touch signal terminals apply touch scan signals to first touch electrodes serving as touch drive electrodes, and second touch signal terminals detect the voltage signal over the second touch electrodes that are generated by coupling out through the mutual capacitor. In the process, if a human contacts one of the sensing bridges in the array substrate, the electric field by his/her body will act on mutual capacitors to cause the capacitance of the mutual capacitor at the sensing bridge to change and thereby the voltage signals of the second touch electrodes that are generated by coupling are changed and the contact location can be determined based on the change of the voltage signals.

In addition, in the array substrate in FIG. 4, during the transition period of time after the touch period of time ends and before a display period of time starts, the first switch signal terminal enables the first switch elements 33 to be turned on, the second switch signal terminal enables the second switch elements 36 to be turned on, all of the first touch electrodes 32 are connected to each other and all of the second touch electrodes 31 are connected to each other to realize charge sharing, so that the charge accumulated in the data line layer and the common electrode layer is eliminated or reduced duo to a neutralization of the positive and the negative charges, or the accumulated charges are uniformly distributed to avoid the occurrence of locally excessive charges.

During the display period of time, each of the first switch elements is turned off and each of the second switch elements are turned off. Here, all of the data lines 37 in the data line layer are independent of each other, the driving circuit inputs the gate drive signals by line-by-line scanning in order to enable the thin film transistors connected to the data lines in the data line layer to be turned on column-by-column and the pixel electrodes of all pixel unit to be charged by the data lines, so that the pixel electrodes and the common electrode(s) form electric fields to control the deflection of liquid crystal molecules to achieve display of an image.

Thus, charge sharing can be realized by the above array substrate according to the embodiment of the present disclosure, which can avoid the interference caused by the touch mode and the display mode of the liquid crystal cell duo to charge accumulation in the conventional technology and reduce or eliminate the problem of the visual artifact and touch insensitivity due to the charge accumulated in the metal electrode while reducing the cost of the array substrate.

It should be understood that the data line layer in this embodiment can be located above the gate line layer of the array substrate, and the data line layer includes the plurality of data lines parallel to each other and source and drain electrodes of the TFT of each of pixel units; the drain electrode of the TFT is connected to a data line, and the gate lines in the gate layer and the data lines may define pixels of pixel regions.

For example, the data lines in the data line layer may be formed from a molybdenum metal or other metal or alloy. For example, the thickness of the data line is between 2000 and 4000 angstroms.

For example, in order to improve the dynamic performance of the touch display device, the polarity of data signals generally needs to be reversed so that the data signal on same one data line is changed once in polarity with respect to the common voltage (Vcom), every time when the polarity is reversed. This results in a larger power consumption of this drive circuit because a current is required to neutralize the existing charge before every time the data signals are output.

In the above described embodiment, during the transition period of time, the charge sharing may be realized if the first switch signal terminal enables the first switch elements to be turned on and the second switch signal terminal enables the second switch element to be turned on, so that the positive and the negative charges over all of the data fines are neutralized with each other so that the current for the neutralization, when the polarity of the data line is reversed, is not required or can be reduced, which reduces the swing amplitude of the display signals that are output by the drive circuit and saves the power consumption of the drive circuit.

For example, in order to improve the touch effect of the array substrate in the application, the first touch electrodes 32 and second touch electrodes 31 may be arranged to be perpendicular to each other, as illustrated in FIG. 4.

According to another aspect of the present disclosure, an embodiment of the present disclosure further provides a touch display device which may include any array substrate described in any embodiment of the present disclosure.

For example, the touch display device may be an electronic paper, a mobile phone, a tablet computer, a television, a monitor, a notebook computer, a digital photo frame, a navigator, a watch, or any product or component with both of a display function and a touch function.

The touch display device in the embodiments of the present disclosure can better improve the display effect (such as reducing artifacts) and the touch effect (increasing the touch sensitivity) and also can simplify the manufacturing process of the touch display device, reduce production cost, and improve the yield of the touch display device.

The touch display device in the embodiments of the present disclosure may be an in-cell touch screen, and the touch display device having the in-cell touch screen possesses the advantages of a thinner thickness, a wider viewing angle, higher performance, and lower cost.

Figure 5:
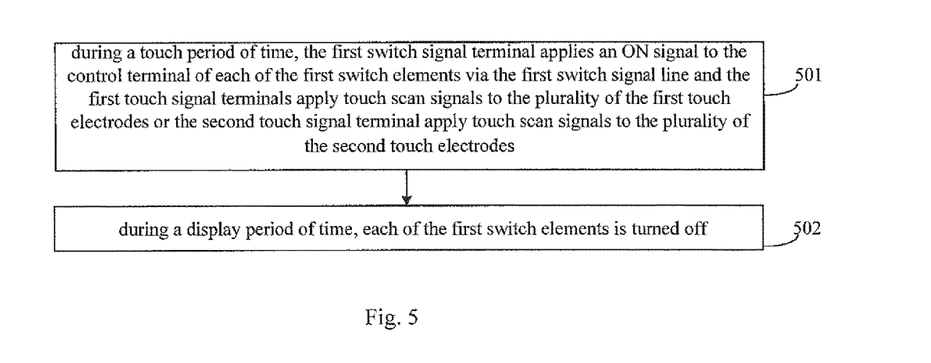
FIG. 5 is a schematic diagram of a flow chart of a driving method of a touch display panel according to a first embodiment of the present disclosure.

As illustrated in FIG. 5, FIG. 5 shows a schematic diagram of a flow chart of a driving method of the touch display device according to the present disclosure, where the touch display device includes the array substrate according to the first embodiment of the present disclosure. The driving method of the touch display device in this embodiment is described as follows.

In step 501, during a touch period of time, the first switch signal terminal applies an ON (turning-on) signal to the control terminal of each of the first switch elements via the first switch signal line, and the first touch signal terminals apply touch scan signals to the plurality of first touch electrodes or the second touch signal terminal apply touch scan signals to the plurality of second touch electrodes.

In step 502, during a display period of time, each of the first switch elements is turned off.

The touch display device, to which the driving method is applicable, may include the array substrate illustrated in FIG. 3 above. Of course, based on a requirement for realizing a certain function, other signals may be applied when the touch display device is driven, for example, gate line drive signals are sequentially applied to the gate lines of the array substrate during the display period of time; however, this is independent of the technical feature of the present disclosure as described above and thus is omitted here. In addition, the drive circuit for the applied signals can be realized in various forms which are well-known in the related field. The feature of "the first touch signal terminals sequentially apply touch scan signals to the plurality of first touch electrodes or the second touch signal terminals sequentially apply touch scan signals to the plurality of second touch electrodes" refers to that the first touch signal terminal sequentially apply the touch scan signals to the plurality of first touch electrodes if the first touch electrodes serve as the touch drive electrodes and the second touch signal terminals sequentially apply the touch scan signals to the plurality of second touch electrodes if the second touch electrode serve as the touch drive electrode.

In the embodiments of the present disclosure, by means of time-division drive, the display function and the touch function of the touch display device are achieved with the data line and the common electrode being reused as the touch electrodes at different time.

Figure 7:
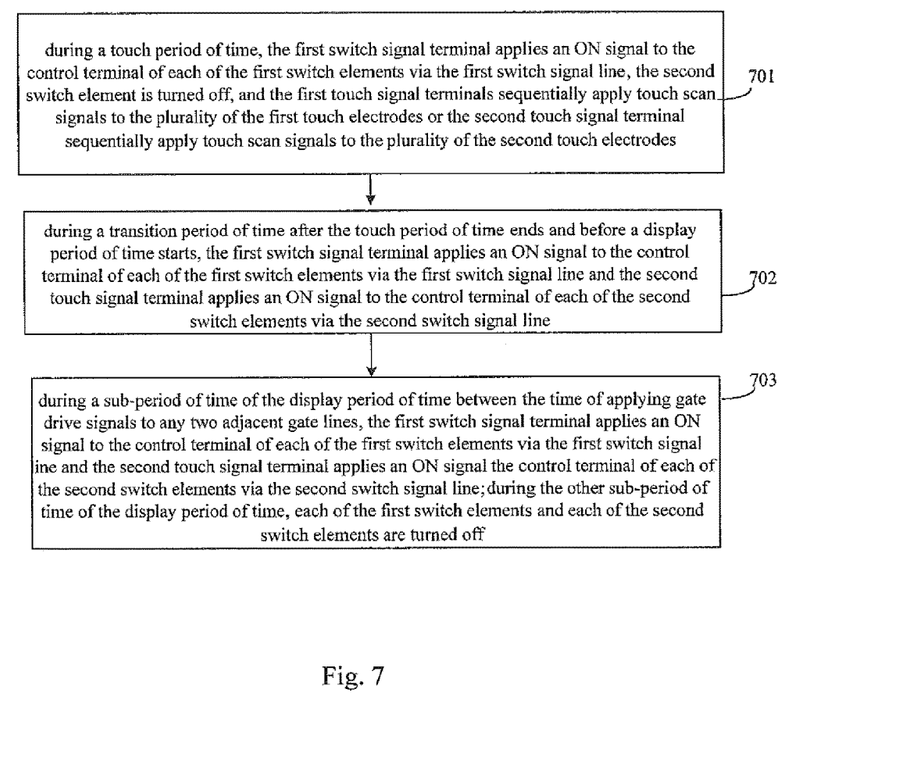
FIG. 7 is a schematic diagram of a flow chart of a driving method of a touch display panel according to a second embodiment of the present disclosure.

As illustrated in FIG. 7, FIG. 7 shows a schematic diagram of a flow chart of a driving method of the touch display device according to the second embodiment of the present disclosure, in which the touch display device includes the array substrate according to the second embodiment of the present disclosure. The driving method of the touch display device in this embodiment is described as follows.

In step 701, during a touch period of time, the first switch signal terminal applies an ON signal to the control terminal of each of the first switch elements via the first switch signal line, the second switch elements are turned off, and the first touch signal terminals sequentially apply touch scan signals to the plurality of first touch electrodes or the second touch signal terminals sequentially apply touch scan signals to the plurality of second touch electrodes.

In step 702, during a transition period of time after the touch period of time ends and before a display period of time starts, the first switch signal terminal applies an ON signal to the control terminal of each of the first switch elements via the first switch signal line and the second touch signal terminal applies an ON signal to the control terminal of each of the second switch elements via the second switch signal line.

In step 703, during a sub-period of time of a display period of time between the time of applying gate drive signals to any two adjacent gate lines, the first switch signal terminal applies an ON signal to the control terminal of each of the first switch elements via the first switch signal line and the second touch signal terminal applies an ON signal the control terminal of each of the second switch elements via the second switch signal line, while during other sub-period of time of the display period of time, each of the first switch elements and each of the second switch elements are turned off.

That is to say, during the display period of time and when a gate drive signal is applied to any one gate line in the array substrate, each of the first switch elements is turned off and each of the second switch elements is turned off; during the display period of time and during a sub-period of time between the time of applying gate drive signals to any two adjacent gate lines in the array substrate, an ON signal is applied to each of the first switch elements and an ON signal is applied to each of the second switch elements. In other embodiment, during the whole display period of time, each of the first switching elements is turned off and each of the second switch elements is turned off.

In one embodiment, the second switch signal terminal, the first switch signal terminal, the first touch signal terminals, and the second touch signal terminals may be connected to different pins of a driving circuit or connected to different driving circuits.

The touch display device, to which the driving method is applicable, may include the array substrate illustrated in FIG. 4 above. Of course, based on a requirement for realizing a function, other signals may be applied when the touch display device is driven; however, this is independent of the technical feature of the present disclosure as described above and thus is omitted here. In addition, the drive circuit of the applied signals can be realized in various forms which are well-known in the related field. Sequentially applying the touch scan signals to the plurality of first touch electrodes or the plurality of second touch electrodes refers to that the drive circuit sequentially applies the touch scan signals to the plurality of first touch electrodes if the first touch electrodes serve as the touch drive electrodes or the drive circuit sequentially apply the touch scan signal to the plurality of second touch electrodes if the second touch electrodes serve as the touch drive electrodes.

Figure 6:
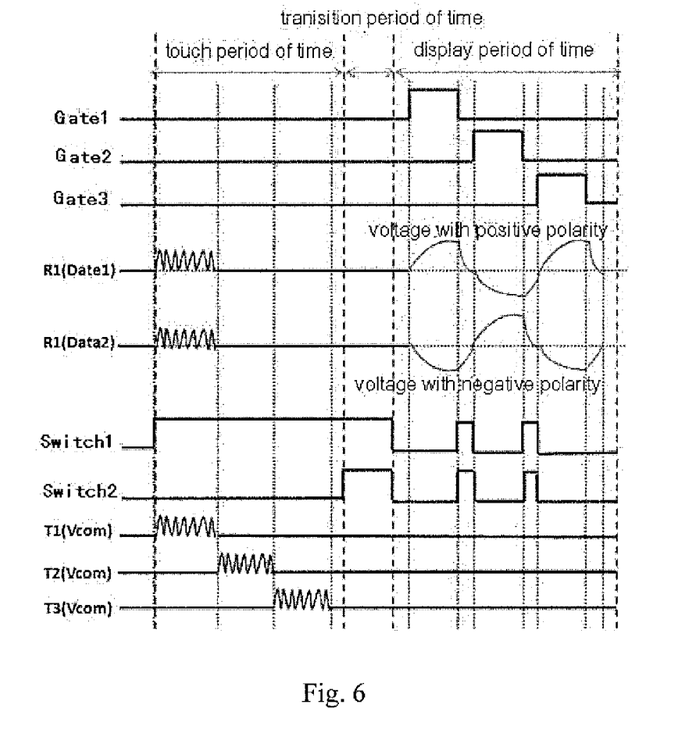
FIG. 6 is a schematic diagram of a waveform of a drive signal of an array substrate according to a second embodiment of the present disclosure.

In order to better understand the driving method of FIG. 7, FIG. 6 shows a schematic diagram of a waveform of the drive signal according to this embodiment. As illustrated, the second touch electrodes (T2, T3, T3, etc.) are sequentially applied with the touch scan signals, during the touch period of time when they serve as the touch drive electrodes, and are applied the common levels during the display period of time when they serve as the common electrodes, the first touch electrodes (R1 including data lines Data1, Data2, etc. and the like) serve as the touch sensing electrodes, and the gate lines (Gate1, Gate2, Gate3, etc.) do not output a signal during the touch period of time and sequentially outputs the scan signals to the gate lines during the display period of time. The first switches (Switch 1) are always turned on during the touch period of time in order to enable the data lines to form the touch sensing electrodes, the second switches (Switch 2) are turned on during the transition period of time, and the first switches and the second switches are turned on during a specific sub-period of time in the display period of time, that is, interval between the time of applying gate drive signals to any two adjacent gate lines.

The waveform of the drive signal in the driving method illustrated in FIG. 5 is different from the waveform of the drive signal in the driving method illustrated in FIG. 7 in that there are no drive signals for the second switches, the first switches are turned off during the display period of time, and the first switches may be turned on or off during the transition period of time as long as it is convenient for the transition to the display period of time.

The driving method illustrated in FIG. 7 can not only enable the positive and negative charges over the adjacent data lines to be neutralized, but also enable the positive and negative charges in the corresponding common electrode layer to be neutralized, which can greatly reduce the touch insensitivity, presence of artifacts, and the power consumption of the driving circuit, as well as the cost of the drive circuit.

Specially, the first switching elements and the second switch elements are turned off during the display period of time and the drive circuit outputs data signals for display to the data lines; in order to improve the dynamic performance of the touch display device, the polarity of the data signal is usually required to be reversed, that is, as illustrated in FIG. 6, the data signal output from the data line is changed once in polarity with respect to the common voltage (Vcom), from a voltage with positive polarity to a voltage with negative polarity or vice versa, after the gate drive signal is outputted from a gate line to the gate electrode of a thin film transistor connected to the gate line, thereby the power consumption of the drive circuit is very large because the existing charges require to be neutralized in reversing of polarity. The driving method illustrated in FIG. 7 can realize charge sharing among the data lines, so that positive and negative charges of all the data lines may be neutralized with each other so that the current for neutralization, when the polarity of the data line is reversed, is not required or can be reduced, which reduces the swing amplitude of the data signals output by the drive circuit and saves the power consumption of the drive circuit.

It should be pointed out that the first switch elements and the second switch elements according to the embodiments of the present disclosure are, for example, transistors, preferably thin film field effect transistors. However, the embodiments of the present disclosure are not limited to the above, the first switch elements and the second switch elements may be of any type of switch elements as long as the definition of the claims to be satisfied.

What are described above is related to the illustrative embodiments of the disclosure only and not limitative to the scope of the disclosure and the scopes of the disclosure are defined by the accompanying claims.

This application claims a priority of Chinese patent application No. 201410386497.5 filed on Aug. 7, 2014, which is entirely incorporated by reference herein as a part of this application.

The invention claimed is:

1. An array substrate comprising:
a data line layer which includes a plurality of first touch electrodes;
a common electrode layer which includes a plurality of second touch electrodes which are arranged to insulate from and cross the first touch electrodes; and
a first switch signal line,
wherein each first touch electrode includes a plurality of data lines and a plurality of first switch elements, a control terminal of each first switch element is connected to the first switch signal line, a first terminal of the first switch element is connected to one data line in the first touch electrode, a second terminal of the first switch element is connected to another data line in the first touch electrode and the first terminal of the first switch element is directly connected to a second terminal of an adjacent first switch element, so that all of the data lines in the first touch electrode are electrically connected to each other upon the first switch element being turned on.

2. The array substrate according to claim 1, wherein the data line connected to the first terminal of the first switch element and the data line connected to the second terminal thereof are adjacent to each other.

3. The array substrate according to claim 2, further including:
a second switch signal line; and
a plurality of second switch elements,
wherein the second switch signal line is connected to the plurality of second touch electrodes via the plurality of second switch elements and is configured such that the plurality of second touch electrodes are electrically connected to each other upon the plurality of second switch elements connected to the plurality of second touch electrodes being turned on, and/or
wherein the second switch signal line is connected to the plurality of first touch electrodes via the plurality of second switch elements and is configured such that the plurality of first touch electrodes are electrically connected to each other upon the plurality of second switch elements connected to the plurality of first touch electrodes being turned on.

4. The array substrate according to claim 3, wherein
for any one of the plurality of second switch elements connected to the plurality of second touch electrodes, a control terminal thereof is connected to the second switch signal line, a first terminal thereof is connected to one second touch electrode, and a second terminal thereof is connected with another second touch electrode; and/or
for any one of the plurality of second switch elements connected to the plurality of first touch electrodes, a control terminal thereof is connected to the second switch signal line, a first terminal thereof is connected to one data line in one of the first touch electrodes, and a second terminal thereof is connected with one data line in another of the second touch electrodes.

5. The array substrate according to claim 3, wherein
for any one of the plurality of second switch elements connected to the plurality of second touch electrodes, the one second touch electrode connected to the first terminal thereof and another second touch electrode connected to the second terminal thereof are adjacent to each other; and/or
for any one of the plurality of second switch elements connected to the plurality of first touch electrodes, the one first touch electrode connected to the first terminal thereof and another first touch electrode connected to the second terminal thereof are adjacent to each other.

6. The array substrate according to claim 1, wherein each of the first touch electrodes includes 15 to 20 data lines; and/or a width of each of the second touch electrodes is from 4 nm to 10 mm.

7. The array substrate according to claim 1, wherein the second touch electrode is made of indium tin oxide.

8. The array substrate according to claim 1, further including:
a second switch signal line; and
a plurality of second switch elements,
wherein the second switch signal line is connected to the plurality of second touch electrodes via the plurality of second switch elements and is configured such that the plurality of second touch electrodes are electrically connected to each other upon the plurality of second switch elements connected to the plurality of second touch electrodes being turned on, and/or
wherein the second switch signal line is connected to the plurality of first touch electrodes via the plurality of second switch elements and is configured such that the plurality of first touch electrodes are electrically connected to each other upon the plurality of second switch elements connected to the plurality of first touch electrodes being turned on.

9. The array substrate according to claim 8, wherein
for any one of the plurality of second switch elements connected to the plurality of second touch electrodes, a control terminal thereof is connected to the second switch signal line, a first terminal thereof is connected to one second touch electrode, and a second terminal thereof is connected with another second touch electrode; and/or
for any one of the plurality of second switch elements connected to the plurality of first touch electrodes, a control terminal thereof is connected to the second switch signal line, a first terminal thereof is connected to one data line in one of the first touch electrodes, and a second terminal thereof is connected with one data line in another of the second touch electrodes.

10. The array substrate according to claim 9, wherein
for any one of the plurality of second switch elements connected to the plurality of second touch electrodes, the one second touch electrode connected to the first terminal thereof and the another second touch electrode connected to the second terminal thereof are adjacent to each other; and/or
for any one of the plurality of second switch elements connected to the plurality of first touch electrodes, the one first touch electrode connected to the first terminal thereof and another first touch electrode connected to the second terminal thereof are adjacent to each other.

11. A driving method for a touch display device including the array substrate according to claim 8, including:
during a touch period of time, applying an ON signal, by first switch signal terminals, to a control terminal of each of the first switch elements via the first switch signal line, turning off the second switch elements, and sequentially applying touch scan signals, by first touch signal terminals, to the plurality of first touch electrodes or sequentially applying touch scan signals, by second touch signal terminals, to the plurality of second touch electrodes;

during a transition period of time after the touch period of time ends and before a display period of time starts, applying an ON signal, by the first switch signal terminal, to the control terminal of each of the first switch elements via the first switch signal line and applying an ON signal, by the second touch signal terminal, to a control terminal of each of the second switch elements via the second switch signal line; and during the display period of time, turning off each of the first switch elements and each of the second switch elements.

12. The driving method according to claim 11, wherein during a sub-period of time of the display period of time between time of applying gate drive signals to any two adjacent gate lines, the first switch signal terminal applies an ON signal to the control terminal of each of the first switch elements via the first switch signal line and the second touch signal terminal applies an ON signal to the control terminal of each of the second switch elements via the second switch signal line; and during other sub-period of time of the display period of time, each of the first switch elements and each of the second switch elements are turned off.

13. A touch display device including the array substrate according to claim 1.

14. The touch display device according to claim 13, wherein the data line connected to the first terminal of the first switch element and the data line connected to the second terminal thereof are adjacent to each other.

15. The touch display device according to claim 13, wherein each of the first touch electrodes includes 15 to 20 data lines; and/or a width of each of the second touch electrodes is from 4 nm to 10 mm.

16. The touch display device according to claim 13, wherein the second touch electrode is made of indium tin oxide.

17. The touch display device according to claim 13, further including:
a second switch signal line; and
a plurality of second switch elements,
wherein the second switch signal line is connected to the plurality of second touch electrodes via the plurality of second switch elements and is configured such that the plurality of second touch electrodes are electrically connected to each other upon the plurality of second switch elements connected to the plurality of second touch electrodes being turned on, and/or wherein the second switch signal line is connected to the plurality of first touch electrodes via the plurality of second switch elements and is configured such that the plurality of first touch electrodes are electrically connected to each other upon the plurality of second switch elements connected to the plurality of first touch electrodes being turned on.

18. The touch display device according to claim 17, wherein
for any one of the plurality of second switch elements connected to the plurality of second touch electrodes, a control terminal thereof is connected to the second switch signal line, a first terminal thereof is connected to one second touch electrode, and a second terminal thereof is connected with another second touch electrode; and/or for any one of the plurality of second switch elements connected to the plurality of first touch electrodes, a control terminal thereof is connected to the second switch signal line, a first terminal thereof is connected to one data line in one of the first touch electrodes, and a second terminal thereof is connected with one data line in another of the second touch electrodes.

19. The touch display device according to claim 18, wherein
for any one of the plurality of second switch elements connected to the plurality of second touch electrodes, the one second touch electrode connected to the first terminal thereof and the another second touch electrode connected to the second terminal thereof are adjacent to each other; and/or for any one of the plurality of second switch elements connected to the plurality of first touch electrodes, the one first touch electrode connected to the first terminal thereof and another first touch electrode connected to the second terminal thereof are adjacent to each other.

20. A driving method for a touch display device including the array substrate according to claim 1, including:
during a touch period of time, applying an ON signal, by a first switch signal terminal, to a control terminal of each of the first switch elements via the first switch signal line, and applying touch scan signals, by first touch signal terminals, to the plurality of first touch electrodes or applying touch scan signals, by second touch signal terminals, to the plurality of second touch electrodes; and during a display period of time, turning off each of the first switch elements.

* * * * *